United States Patent
Felts (12) United States Patent (10) Patent No.: US 7,513,953 B1
Felts (45) Date of Patent: Apr. 7, 2009

(54) CONTINUOUS SYSTEM FOR DEPOSITING FILMS ONTO PLASTIC BOTTLES AND METHOD

(75) Inventor: John T. Felts, Alameda, CA (US)

(73) Assignee: Nano Scale Surface Systems, Inc., Alameda, CA (US)

( * ) Notice: Subject to any disclaimer, the term of this patent is extended or adjusted under 35 U.S.C. 154(b) by 271 days.

(21) Appl. No.: 10/992,033

(22) Filed: Nov. 17, 2004

Related U.S. Application Data (60) Provisional application No. 60/525,313, filed on Nov. 25, 2003.

(51) Int. Cl.
*C23C 16/00* (2006.01)
*C23C 16/455* (2006.01)
*C23C 16/458* (2006.01)
*C23C 16/50* (2006.01)
*C23C 16/503* (2006.01)
*C23C 16/54* (2006.01)

(52) U.S. Cl. .................. 118/719; 118/715; 118/723 R; 118/723 E; 118/729; 118/730

(58) Field of Classification Search .............. 118/715, 118/719, 723 R, 723 E, 728–730, 50.1; 156/345.31, 156/345.33, 345.43, 345.44, 345.51, 345.54, 156/345.55
See application file for complete search history.

(56) References Cited

U.S. PATENT DOCUMENTS

| | | | |
|---|---|---|---|
| 1,574,307 A | 2/1926 | Risser | |
| 2,052,728 A | 9/1936 | Stewart | 215/73 |
| 2,564,400 A | 8/1951 | Hall | 128/173 |
| 2,698,076 A | 12/1954 | Nilsson | |
| 3,889,800 A | 6/1975 | Frische | 198/179 |
| 4,075,820 A * | 2/1978 | Standley | 53/329.4 |
| 4,467,909 A | 8/1984 | Jörss | 198/481 |
| 4,807,421 A | 2/1989 | Araki et al. | 53/167 |
| 4,883,192 A | 11/1989 | Krugman | 220/85 |
| 5,565,248 A * | 10/1996 | Plester et al. | 427/571 |
| 5,711,411 A | 1/1998 | Zurweller | 198/470.1 |
| 5,727,369 A * | 3/1998 | Mosse | 53/467 |
| 5,798,139 A * | 8/1998 | Nagashima et al. | 427/237 |

(Continued)

FOREIGN PATENT DOCUMENTS

WO  WO 03/100115  * 12/2003

OTHER PUBLICATIONS

Felts, U.S. Appl. No. 11/373,224, filed Mar. 10, 2006, entitled "Bottle adapter for fixed clip handling system".

*Primary Examiner*—Jeffrie R Lund
(74) *Attorney, Agent, or Firm*—Gunnison, Mckay & Hodgson, L.L.P.; Serge J. Hodgson (57) ABSTRACT

A bottle processing apparatus includes a rotary bottle vacuum transfer system and a bottle coating system. The rotary bottle vacuum transfer system takes bottles from atmospheric pressure and transfers the bottles to the bottle coating system at a sub-atmospheric pressure in a continuous assembly line fashion. In the bottle coating system, a thin film coating having barrier properties is formed on at least one surface of the bottles in a continuous assembly line fashion. After formation of the thin film coating, the rotary bottle vacuum transfer system returns the bottles from the sub-atmospheric pressure region of the bottle coating system back to atmospheric pressure in a continuous assembly line fashion.

21 Claims, 9 Drawing Sheets

U.S. PATENT DOCUMENTS

| | | | |
|---|---|---|---|
| 5,849,366 A * | 12/1998 | Plester | 427/491 |
| 5,900,284 A | 5/1999 | Hu | 427/489 |
| 5,900,285 A | 5/1999 | Walther et al. | 427/491 |
| 5,972,436 A | 10/1999 | Walther | 427/535 |
| 5,993,598 A | 11/1999 | Hu | 156/345 |
| 6,009,733 A * | 1/2000 | Cheers et al. | 72/17.3 |
| 6,055,929 A | 5/2000 | Hu | 118/723 |
| 6,112,695 A | 9/2000 | Felts | 118/723 |
| 6,117,243 A | 9/2000 | Walther | 118/713 |
| 6,132,562 A * | 10/2000 | Baumecker et al. | 204/192.12 |
| 6,149,982 A * | 11/2000 | Plester | 427/491 |
| 6,180,191 B1 | 1/2001 | Felts | 427/569 |
| 6,196,154 B1 * | 3/2001 | Baumecker et al. | 118/723 VE |
| 6,223,683 B1 | 5/2001 | Plester et al. | 118/723 |
| 6,251,233 B1 | 6/2001 | Plester et al. | 204/192.38 |
| 6,276,296 B1 | 8/2001 | Plester | 118/723 |
| 6,279,505 B1 | 8/2001 | Plester et al. | 118/723 |
| 6,294,226 B1 | 9/2001 | Shimamura | 427/577 |
| 6,328,805 B1 * | 12/2001 | Rius | 118/715 |
| 6,335,054 B1 * | 1/2002 | Baumecker et al. | 427/255.5 |
| 6,390,020 B1 | 5/2002 | Hu et al. | 118/723 |
| 6,520,318 B1 | 2/2003 | Humele | 198/483.1 |
| 6,565,791 B1 | 5/2003 | Laurent | 264/455 |
| 6,622,882 B2 | 9/2003 | Smith | 220/259.1 |
| 6,851,565 B2 | 2/2005 | Stephan | 215/389 |
| 6,958,097 B2 * | 10/2005 | Luttringhaus-Henkel et al. | 118/503 |
| 2001/0042510 A1 * | 11/2001 | Plester | 118/723 E |
| 2003/0150858 A1 * | 8/2003 | Outreman et al. | 220/62.11 |
| 2003/0219547 A1 * | 11/2003 | Arnold et al. | 427/569 |
| 2003/0232150 A1 * | 12/2003 | Arnold et al. | 427/569 |
| 2004/0091650 A1 * | 5/2004 | Krempel-Hesse et al. | 428/35.7 |
| 2006/0086320 A1 * | 4/2006 | Lizenberg et al. | 118/719 |
| 2006/0150909 A1 * | 7/2006 | Behle et al. | 118/719 |
| 2006/0151420 A1 | 7/2006 | Espenschied | 215/276 |

* cited by examiner

CONTINUOUS SYSTEM FOR DEPOSITING FILMS ONTO PLASTIC BOTTLES AND METHOD

CROSS-REFERENCE TO RELATED APPLICATIONS

This application claims the benefit of U.S. Provisional Application No. 60/525,313, filed on Nov. 25, 2003, entitled "SYSTEM AND METHOD FOR DEPOSITING INORGANIC THIN FILMS ONTO THE INTERIOR OF PLASTIC BOTTLES", of John T. Felts, which is herein incorporated by reference in its entirety.

BACKGROUND OF THE INVENTION

1. Field of the Invention

This invention relates to a system and method for depositing oxide and other inorganic materials onto the inside surface of 3 dimensional shapes, such as bottles, at high rates appropriate for production environments.

2. Description of the Related Art

One of the greatest challenges in the plastics packaging business has been the reduction of gas transfer through polymeric materials to either stop gases from ingressing into the packaged product, or to stop gases from egressing from the packaged product. There have been many approaches attempted including new resin formulations and multi-layers of polymeric materials, but each has had problems finding widespread acceptance due to either the cost, non-recyclability or the performance.

Traditionally, polyester terephalate (PET) is the polymer of choice when gas barrier is needed in plastic packaging. In the three-dimensional (or rigid packaging area), PET is used in almost all applications where shelf-life and clarity are required.

Rigid packaging, sometimes called three-dimensional packaging, includes bottles, cans, cups and typically excludes the so-called flexible packaging. Examples of flexible packaging include pouches, and bags.

Although widely used in rigid packaging, PET is limited in its ability to provide gas barrier to both gas coming into the product (gas ingress) and escaping (gas egress). In the case of beer, a highly oxygen sensitive beverage, even the oxygen that is adsorbed in the wall of the PET bottle can significantly alter the taste and shelf-life of the beer. For carbonated soft drinks (CSD), on the other hand, the barrier must stop carbon dioxide from escaping out of the beverage and there are little to no concerns about the ingress of gases.

There are three conventional approaches to providing barriers in PET bottles; multi-layers, mono-layers, and surface coatings. The first approach is to provide a multi-layer structure that sandwiches the PET structural layers around a core, a single layer or multiple layers, containing higher-priced barrier materials.

This first approach has been utilized by incorporating ethylene vinyl alcohol (EVOH) as the core. EVOH provides excellent oxygen barrier properties, however, EVOH is highly moisture sensitive and the barrier properties deteriorate with exposure to water. Other materials such as nylon have also been investigated but have had issues with recyclability and cost.

There are several new barrier materials including nylon-based nanocomposites and "passive-active" barrier systems. The passive-active barrier systems include dual-acting formulations of a passive barrier material and an active oxygen scavenger that blocks oxygen by adsorbing it chemically. Both of these materials have been successfully integrated into multi-layer structures, however, none have been demonstrated to be recyclable, and due to the high cost of the barrier materials, the overall cost of the package is outside of acceptable limits.

The "ideal" route to providing barriers in PET bottles (and the second conventional approach) is to use a monolayer that either incorporates a barrier material (mixed with PET to reduce cost) or is formed of a single polymer. There are, however, few practical monolayer materials under development. Further, there is still the significant issue of recycle of the monolayer, since the current recycle streams for polymers are set-up to handle only polyolefins (which offer no barrier to oxygen) and PET. Any composite material (incorporating PET) or other polymer would potentially contaminate the current recycle streams.

The third conventional approach to providing barriers in PET bottles is surface coating technologies where a thin layer is applied to either the exterior or interior surface of the PET bottle. If a polymer is used, the same issues discussed above are present for recycle. Thus, the current focus of this area is the deposition of thin film coatings of silicon oxide or a carbon based material.

Thin films are defined as coatings that are measured on the angstrom (Å) level. Typically, the thin film coatings discussed as barrier materials range in thickness from 100-5000 Å in total thickness.

There are two approaches currently being developed for the deposition of the thin film coatings, physical vapor deposition and chemical vapor deposition. For examples of physical vapor deposition techniques, see U.S. Pat. Nos. 6,279,505, 6,276,296, 6,251,233, 6,223,683, 6,520,318.

Physical vapor deposition techniques have not been successful due to the application of the thin film onto the exterior surface of the bottle and the inherent damage that the thin film incurs during subsequent processing such as during filling, labeling, capping and transportation. To prevent this damage to the thin film, a second additional coating that protects the thin film from damage was sprayed onto the thin film. This additional coating adds processing time and increases the cost of the barrier technology and final package.

The second approach currently being developed for the deposition of the thin film coatings is by chemical vapor deposition utilizing plasma enhanced chemical vapor deposition (PECVD), where the coating is derived from gases that are decomposed within the bottle by a plasma. The plasma, an electrically ionized gas, is created by coupling power into the gas mixture (held at a pressure significantly lower than atmospheric pressure) through an electric field. The PECVD approach can be broken down further into carbon and silicon based chemistries. For examples of carbon based and silicon based coatings see U.S. Pat. No. 6,294,226 and U.S. Pat. Nos. 6,565,791, 6,117,243, 5,972,436, 5,900,285, 6,390,020, 6,055,929, 5,993,598, 5,900,284, 6,180,191 and 6,112,695.

In the application of the surface coating technologies, one of the key performance factors is the speed at which the bottles are coated. The coating speed should be near the rate at which bottles are produced from blow molding, which currently averages around 20,000 bottles per hour (bph), but can be as high as 60,000 bph.

If the coating speed cannot achieve at least 20,000 bph and be extendable to at least 40,000 bph, there will be significant limitations in terms of the utilization efficiency of the apparatus. With current trends, a desirable technology should be extendable to 40,000 bph. As will be discussed below, one significant limitation of existing surface coating applications based on thin film materials (carbon or silicon based), is that no commercial equipment can be extended beyond 10,000 bph.

To date, each bottle that is coated on the interior with a thin film coating has been treated as a separate entity. In this approach, the interior of each bottle and the surrounding environment are evacuated (with a vacuum pump) to process pressures, then gases are injected into the bottle and a plasma is ignited. The plasma, in contact with the interior of the plastic bottle, results in the thin film coating.

Once the coating process is completed, the bottle is evacuated a second time, and then vented to atmospheric pressure. Since each bottle is treated independent of other bottles, pumping, gas and power systems must be duplicated for each individual bottle reactor. This results in duplication of costs, but more importantly, results in significant increases in process cycle time (defined as the time from when a bottle enters the machine until it exits with a thin film coating on the inside). In addition, the only means to increase the number of bottles processed through the machine (assuming that the coating time is constant), is to increase the number of coating cells and associated hardware. This results in significant increases in the size and cost of the equipment.

SUMMARY OF THE INVENTION

In accordance with one embodiment of the present invention, a bottle processing apparatus includes a rotary bottle vacuum transfer system and a bottle coating system. The rotary bottle vacuum transfer system takes bottles from atmospheric pressure, sometimes called ambient pressure, and transfers the bottles to the bottle coating system at a sub-atmospheric pressure in a continuous assembly line fashion. In the bottle coating system, a thin film coating having barrier properties is formed on at least one surface of the bottles in a continuous assembly line fashion. After formation of the thin film coating, the rotary bottle vacuum transfer system returns the bottles from the sub-atmospheric pressure region of the bottle coating system back to atmospheric pressure.

The bottles are coated using the bottle processing apparatus in a continuous assembly line fashion at a high rate appropriate for commercial production environments. In one embodiment, the bottles are coated at a rate of at least 20,000 bph, e.g., 40,000 bph, thus maximizing the utilization efficiency of the bottle processing apparatus.

Further, the bottles are treated continuously in an assembly line fashion using common pumping, gas and power systems. This avoids duplication of costs and results in a significant decrease in process cycle time.

In one embodiment, the bottle processing apparatus is capable of depositing silicon dioxide thin films with gas barrier improvements (over the base polymer) of at least 2× at rates exceeding 10,000 bottles per hour.

In another embodiment, the bottle processing apparatus is capable of producing silicon dioxide interior coated bottles at rates exceeding 20,000 bottles per hour with gas barrier improvements of 2-30×.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
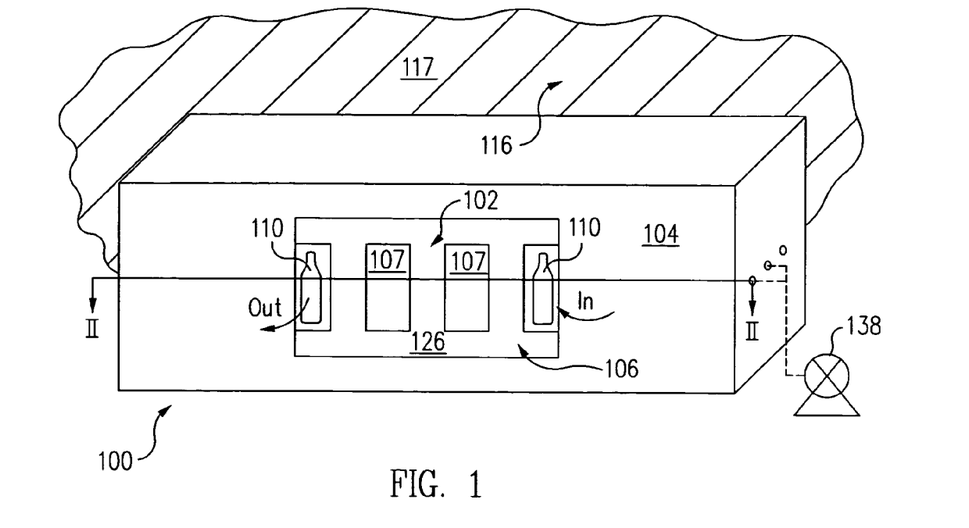
FIG. 1 is a perspective view of a rotary bottle vacuum transfer system in accordance with one embodiment of the present invention.
Figure 2:
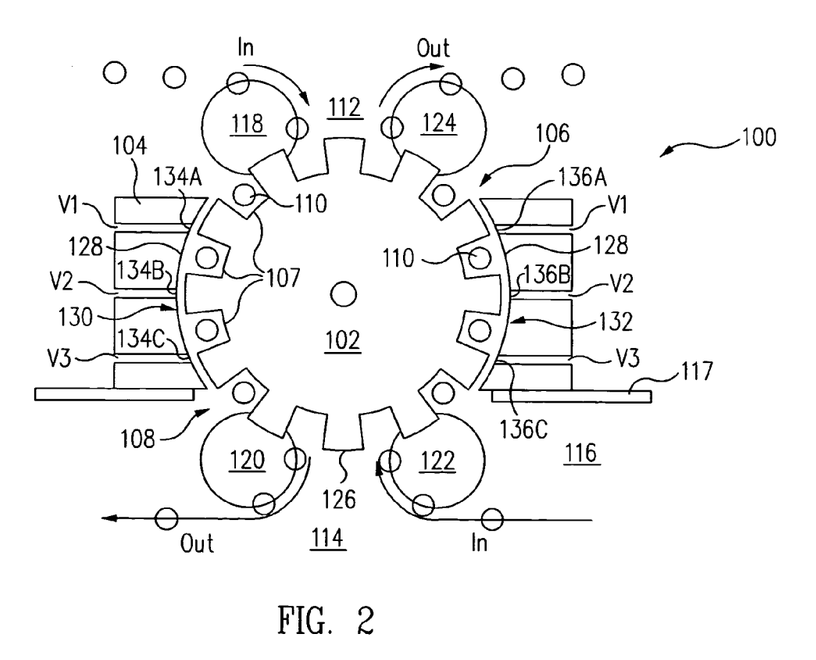
FIG. 2 is a cross-sectional view of the rotary bottle vacuum transfer system of FIG. 1 along the line II-II in accordance with one embodiment of the present invention.

FIG. 1 is a perspective view of a rotary bottle vacuum transfer system 100 in accordance with one embodiment of the present invention. FIG. 2 is a cross-sectional view of rotary bottle vacuum transfer system 100 of FIG. 1 along the line II-II in accordance with one embodiment of the present invention.

Referring now to FIGS. 1 and 2 together, rotary bottle vacuum transfer system 100, sometimes called a rotary delivery mechanism, includes a rotary bottle transfer wheel 102 within a chamber 104. Chamber 104 includes an atmospheric port 106 and a vacuum port 108.

Bottles 110, e.g., PET bottles, are continuously transferred from an exterior region 112 at atmospheric pressure into rotary bottle vacuum transfer system 100 through atmospheric port 106. Bottles 110 are continuously brought from atmospheric pressure to a sub-atmospheric pressure, e.g., in the range of 1-1000 mTorr (10-100 mTorr in one embodiment), within bottle vacuum transfer system 100. Bottles 110 are continuously transferred at a sub-atmospheric pressure from bottle vacuum transfer system 100 through vacuum port 108 to an interior region 114 also at a sub-atmospheric pressure.

In one embodiment, interior region 114 is a sub-atmospheric pressure region located within a bottle coating system 116 mounted to rotary bottle vacuum transfer system 100. For example, rotary bottle vacuum transfer system 100 is mounted to a chamber wall 117 of bottle coating system 116, sometimes called a vacuum chamber. In accordance with one embodiment, an inorganic thin film is continuously formed on the interior and/or exterior surfaces of bottles 110 within the bottle coating system as discussed further below.

After processing, bottles 110 are continuously transferred from interior region 114 at the sub-atmospheric pressure into rotary bottle vacuum transfer system 100 through vacuum port 108. Bottles 110 are continuously brought from the sub-atmospheric pressure to atmospheric pressure within rotary bottle vacuum transfer system 100. Bottles 110 are continuously transferred at atmospheric pressure from rotary bottle vacuum transfer system 100 through atmospheric port 106 to exterior region 112, which is at atmospheric pressure.

As set forth above, bottles 110 are continuously transferred to and from bottle coating system 116 in a continuous assembly line fashion. To facilitate this continuous transfer, rotary bottle transfer wheel 102 includes a plurality of bottle cutouts 107 into which bottles 110 are inserted and removed. A continuous assembly line fashion in accordance with one embodiment is an arrangement where bottles 110 are in continuous motion and move along a common path.

For example, bottles 110 are inserted through atmospheric port 106 and into bottle cutouts 107 by a first transfer wheel 118. Bottles 110 are removed through vacuum port 108 and from bottle cutouts 107 by a second transfer wheel 120. Similarly, bottles 110 are inserted through vacuum port 108 and into bottle cutouts 107 by a third transfer wheel 122. Bottles 110 are removed through atmospheric port 106 and from bottle cutouts 107 by a fourth transfer wheel 124. Transfer wheels such as transfer wheels 118, 120, 122 and 124 are well known to those of skill in the art and so are not discussed in detailed to avoid detracting from the principles of the invention. Further, bottles 110 can either be held in-place (for example by the neck of the bottle) through rotary bottle vacuum transfer system 100, or conveyed by an appropriate means.

In accordance with this embodiment, rotary bottle transfer wheel 102 is cylindrically shaped. More particularly, rotary bottle transfer wheel 102 includes an exterior cylindrical surface 126, in which bottle cutouts 107 are formed. Further, chamber 104 includes an interior cylindrical surface 128 directly adjacent and corresponding to exterior cylindrical surface 126 of rotary bottle transfer wheel 102.

As used herein, a cylindrical surface is a surface lying within the curved exterior surface of a circular cylinder. For example, referring to FIG. 2, interior cylindrical surface 128 of chamber 104 includes a first pressure reduction section 130 and a second pressure increasing section 132, pressure reduction section 130 and pressure increasing section 132 both lying within the curved exterior surface of a common cylinder. Pressure reduction section 130 and pressure increasing section 132 are sometimes called curved interior chamber walls.

Interior cylindrical surface 128 and, more particularly, pressure reduction section 130 and pressure increasing section 132 include at least one vacuum port, e.g., an aperture or apertures. In accordance with this embodiment, pressure reduction section 130 includes three vacuum ports 134A, 134B, 134C, collectively vacuum ports 134. Similarly, pressure increasing section 132 includes three vacuum ports 136A, 136B, 136C, collectively vacuum ports 136.

Vacuum ports 134 and 136 are coupled to a source of vacuum, for example, to a single vacuum pump 138. During use, vacuum is provided to vacuum ports 134 and 136. This vacuum evacuates the small space between exterior cylindrical surface 126 of rotary bottle transfer wheel 102 and interior cylindrical surface 128 of chamber 104. Further, this vacuum evacuates bottle cutouts 107 and thus bottles 110 located within bottle cutouts 107.

Accordingly, bottles 110 are continuously evacuated using a single vacuum pump 138 in accordance with this embodiment. Accordingly, the capital equipment and operation costs of rotary bottle vacuum transfer system 100 is minimized compared to a configuration where each bottle is treated independent of other bottles in an individual bottle reactor, requiring a duplication of pumping, gas and power systems.

Generally, atmospheric air leaking in through atmospheric port 106 is continuously removed through vacuum ports 134, 136. Accordingly, in one embodiment, pressure within chamber 104 adjacent vacuum ports 134A, 136A is greatest, pressure within chamber 104 adjacent vacuum ports 134C, 136C is least, and pressure within chamber 104 adjacent vacuum ports 134B, 136B is between the pressure adjacent vacuum ports 134A, 136A and the pressure adjacent vacuum ports 134C, 136C.

However, in another embodiment, residual process gas from bottle coating system 116, e.g., leaking in though vacuum port 108 or trapped inside of bottles 110 is primarily removed through vacuum ports 134C, 136C. Accordingly, pressure within chamber 104 adjacent vacuum ports 134C, 136C may be greater than the pressure within chamber 104 adjacent vacuum ports 134B, 136B depending upon the volume of residual process gas being removed.

In accordance with one embodiment, different vacuum sources are coupled to vacuum ports 134, 136. For example, a first vacuum source, sometimes called a roughing pump, is coupled to vacuum ports 134A, 136A. This first vacuum source is designed to remove large volumes of air at a relatively high pressure. A second vacuum source, sometimes called a low-pressure vacuum pump, is coupled to vacuum ports 134C, 136C. This second vacuum source is designed to remove small volumes of air at a relatively low-pressure. Further, vacuum ports 134B, 136B are coupled to either the first vacuum source or the second vacuum source, or to a further third vacuum source.

Figure 3:
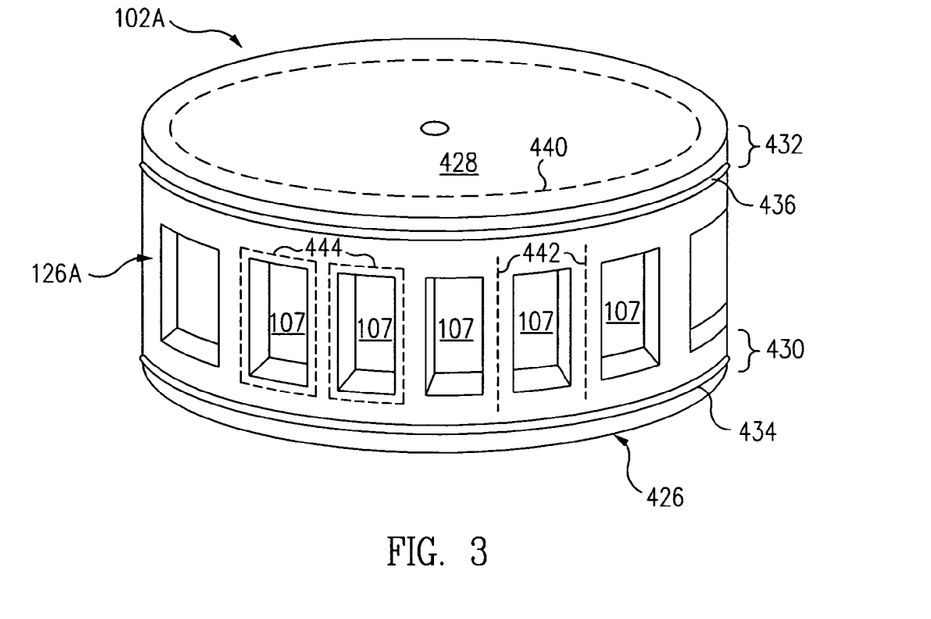
FIG. 3 is a perspective view of a rotary bottle transfer wheel in accordance with one embodiment of the present invention.
Figure 4:
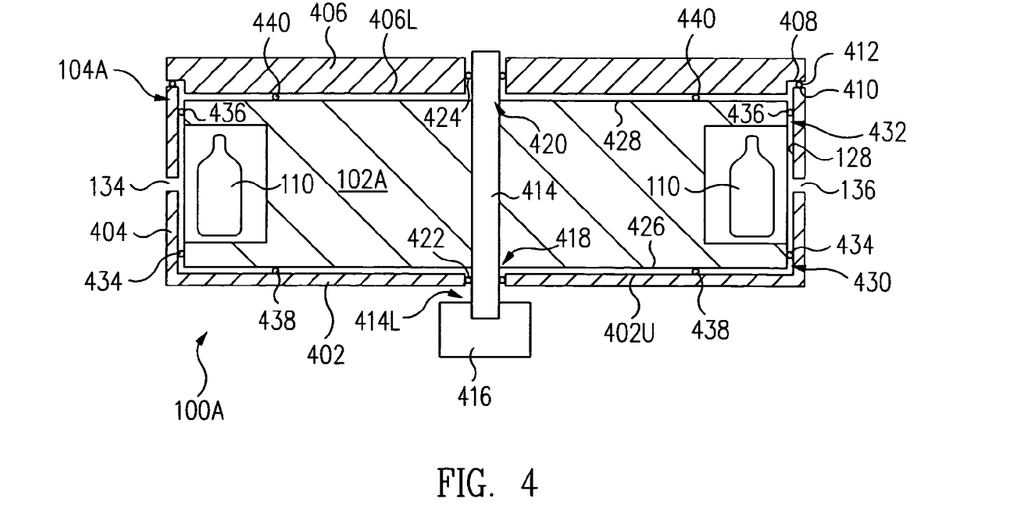
FIG. 4 is a cross-sectional view of a rotary bottle vacuum transfer system incorporating the rotary bottle transfer wheel of FIG. 3 in accordance with one embodiment of the present invention.

FIG. 3 is a perspective view of a rotary bottle transfer wheel 102A in accordance with one embodiment of the present invention. FIG. 4 is a cross-sectional view of a rotary bottle vacuum transfer system 100A incorporating the rotary bottle transfer wheel 102A of FIG. 3 in accordance with one embodiment of the present invention.

Referring now to FIGS. 3 and 4 together, rotary bottle vacuum transfer system 100A includes a chamber 104A. Chamber 104A includes a base 402, a cylindrical sidewall 404, and a lid 406. In one embodiment, base 402 and lid 406 are in the shape of disks although can be formed in any one of a number of shapes. Further, cylindrical sidewall 404 is in the shape of a hollow cylinder and includes vacuum ports 134, 136 as discussed above. However, cylindrical sidewall 404 can be formed in any one of a number of shapes and typically includes an interior cylindrical surface 128.

In one embodiment, base 402 is integral with cylindrical sidewall 404, i.e., base 402 and cylindrical sidewall 404 are a single piece and not a plurality of separate pieces connected together. However, in another embodiment, base 402 and cylindrical sidewall 404 are separate pieces connected together with a vacuum seal in between, e.g., with an O-ring in between.

In accordance with this embodiment, lid 406 is a separate piece mounted, e.g., bolted, to cylindrical sidewall 404. Lid 406 includes an annular seal surface 408 at a periphery of a lower surface 406L of lid 406. Further, cylindrical sidewall 404 includes a corresponding annular seal surface 410 at the top of cylindrical sidewall 404. An O-ring 412 is located between annular seal surface 408 and annular seal surface 410 and forms a seal therebetween.

Rotary bottle transfer wheel 102A is mounted on a vertical axle 414. At a lower, e.g., first, end 414L of axle 414, axle 414 is coupled to a motor 416. During use, motor 416 turns axle 414 and thus rotates rotary bottle transfer wheel 102A.

Axle 414 extends through axle ports 418, 420 of base 402, lid 406, respectively. Seals 422, 424, e.g., O-rings, form vacuum tight seals between axle 414 and base 402, lid 406, respectively. Thus, in accordance with this embodiment, chamber 104A forms a vacuum tight enclosure around rotary bottle transfer wheel 102A.

To further enhance the isolation of each of bottles 110 from one another, in accordance with one embodiment, at least one sliding seal between rotary bottle transfer wheel 102A and chamber 104A is used. More particularly, rotary bottle transfer wheel 102A includes an exterior cylindrical surface 126A. Exterior cylindrical surface 126A extends from a bottom, e.g., first, surface 426 to a top, e.g., second, surface 428 of rotary bottle transfer wheel 102A. Bottom and top surfaces 426, 428 are circular in area.

Exterior cylindrical surface 126A of rotary bottle transfer wheel 102A includes a cylindrical lower, e.g., first, seal region 430 between bottle cutouts 107 and bottom surface 426. Similarly, exterior cylindrical surface 126A of rotary bottle transfer wheel 102A includes a cylindrical upper, e.g., second, seal region 432 between bottle cutouts 107 and top surface 428.

O-rings 434, 436 form sliding seals between lower and upper seal regions 430, 432 and interior cylindrical surface 128 of chamber 104A.

In one embodiment, O-rings 434, 436 are mounted within lower and upper seal regions 430, 432, respectively, for example, within O-ring grooves of lower and upper seal regions 430, 432. In accordance with this embodiment, O-rings 434, 436 slide along interior cylindrical surface 128 of chamber 104A.

In another embodiment, O-rings 434, 436 are mounted within interior cylindrical surface 128 of chamber 104A, for example, within O-ring grooves of interior cylindrical surface 128 of chamber 104A. In accordance with this embodiment, O-rings 434, 436 slide along lower and upper seal regions 430, 432, respectively, of rotary bottle transfer wheel 102A.

Although one particular configuration of sliding seals to enhance the isolation of each of bottles 110 from one another is set forth above, in accordance with other embodiments, other sliding seals are used. For example, an O-ring 438 forms a sliding seal between bottom surface 426 and an upper, e.g., first, surface 402U of base 402. Similarly, an O-ring 440 forms a sliding seal between top surface 428 and lower surface 406L of lid 406.

O-rings 434, 436, 438 and 440 are examples of circumferential seals. More particularly, O-rings 434, 436, 438 and 440 are each located at fixed radial distances from axle 414 such that O-rings 434, 436, 438 and 440 lie on circumferences of circles when viewed from above.

In other embodiments, referring now to FIG. 3, longitudinal seals are used. For example, longitudinal seals 442 extends vertically upwards between bottle cutouts 107. Linear seals 442 are mounted to exterior cylindrical surface 126A, e.g., within grooves. During use, linear seals 442 slide along interior cylindrical surface 128 of chamber 104A and form seals between exterior cylindrical surface 126A of rotary bottle transfer wheel 102A and interior cylindrical surface 128 of chamber 104A between each of bottle cutouts 107.

In another embodiment, bottle cutout isolation seals are used. For example, referring to FIG. 3, O-rings 444 are mounted to exterior cylindrical surface 126A around the periphery of each of bottle cutouts 107, e.g., within grooves. During use, O-rings 444 slide along interior cylindrical surface 128 of chamber 104A and form seals between exterior cylindrical surface 126A of rotary bottle transfer wheel 102A and interior cylindrical surface 128 of chamber 104A around each of bottle cutouts 107.

Bottle cutouts 107 are rectangular openings in exterior cylindrical surface 126A in accordance with this embodiment. More particularly, bottle cutouts 107 are spaced from and do not extend all the way to bottom surface 426 or top surface 428. However, bottle cutouts 107 can be formed in other shapes such as that set forth below in reference to FIGS. 5, 6 and 7.

Figure 5:
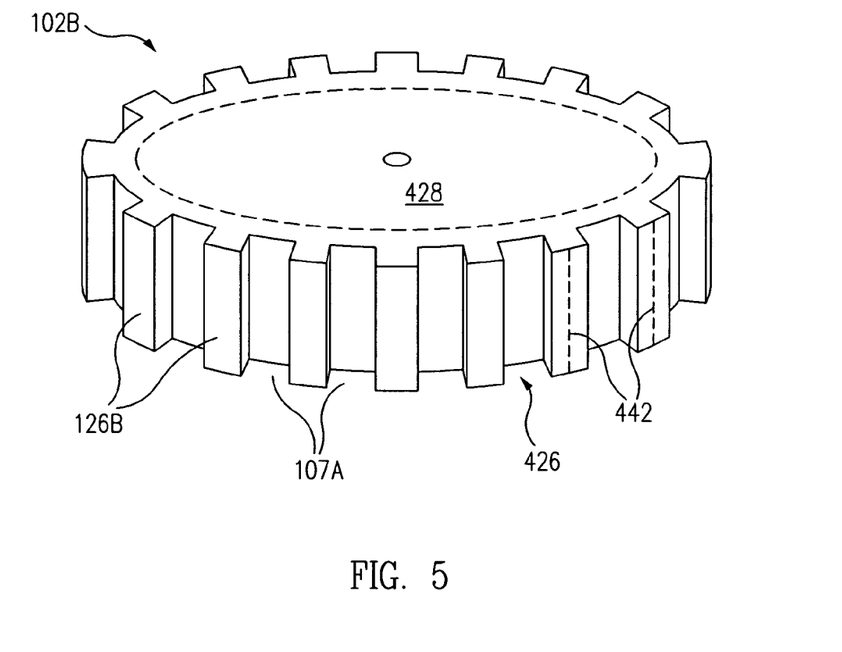
FIG. 5 is a perspective view of a rotary bottle transfer wheel in accordance with another embodiment of the present invention.
Figure 6:
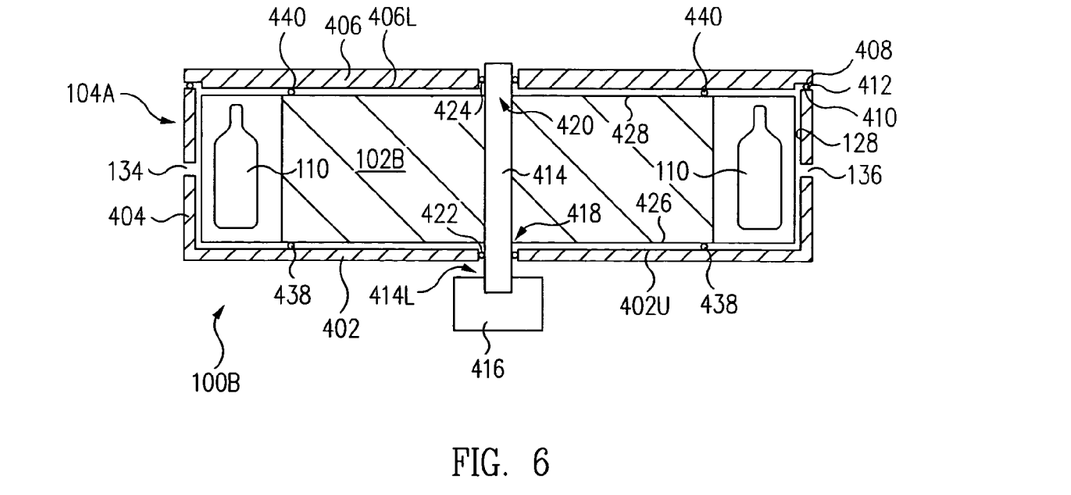
FIG. 6 is a cross-sectional view of a rotary bottle vacuum transfer system incorporating the rotary bottle transfer wheel of FIG. 5 in accordance with one embodiment of the present invention.

FIG. 5 is a perspective view of a rotary bottle transfer wheel 102B in accordance with another embodiment of the present invention. FIG. 6 is a cross-sectional view of a rotary bottle vacuum transfer system 100B incorporating rotary bottle transfer wheel 102B of FIG. 5 in accordance with one embodiment of the present invention. Rotary bottle vacuum transfer system 100B of FIG. 6 is substantially similar to rotary bottle vacuum transfer system 100A of FIG. 4 and only the significant differences between rotary bottle vacuum transfer systems 100A and 100B are discussed below.

In accordance with this embodiment, bottle cutouts 107A extend from bottom surface 426 to top surface 428 of rotary bottle transfer wheel 102B. More particularly, bottle cutouts 107A are slots in an exterior cylindrical surface 126B extending longitudinally from bottom surface 426 to top surface 428. Accordingly, rotary bottle transfer wheel 102B is sometimes said to be in the shape of a gear.

Figure 7:
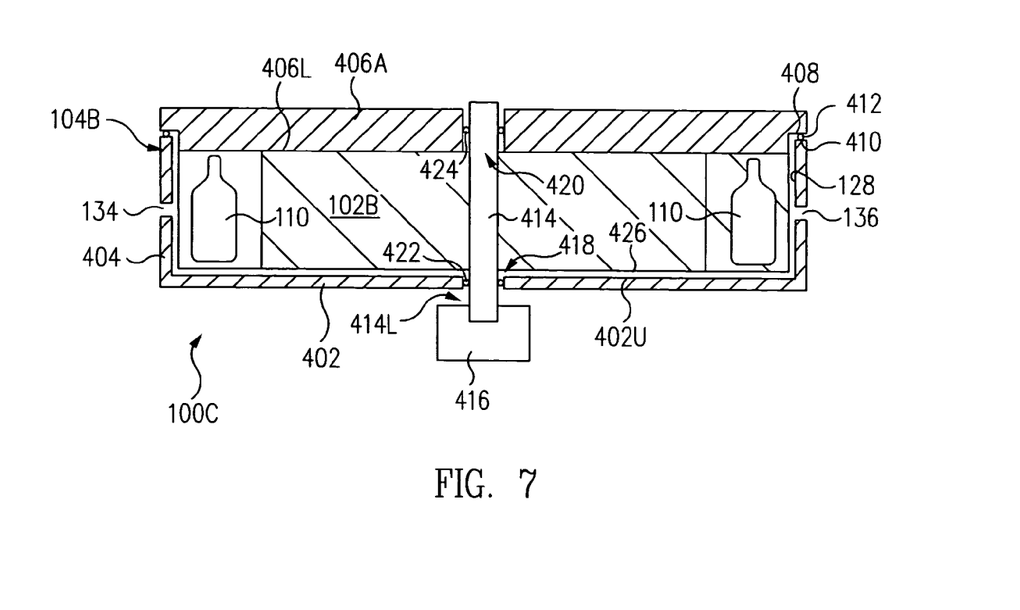
FIG. 7 is a cross-sectional view of a rotary bottle vacuum transfer system incorporating the rotary bottle transfer wheel of FIG. 5 in accordance with another embodiment of the present invention.

FIG. 7 is a cross-sectional view of a rotary bottle vacuum transfer system 100C incorporating the rotary bottle transfer wheel 102B of FIG. 5 in accordance with another embodiment of the present invention. Rotary bottle vacuum transfer system 100C of FIG. 7 is substantially similar to rotary bottle vacuum transfer system 100A of FIG. 4 and only the significant differences between rotary bottle vacuum transfer systems 100A and 100C are discussed below.

Referring now to FIG. 7, rotary bottle transfer wheel 102B is mounted to a lid 406A of a chamber 104B. Accordingly, lid 406A rotates along with rotary bottle transfer wheel 102B. More particularly, during use, lid 406A rotates relative to cylindrical sidewall 404 of chamber 104B. Accordingly, O-ring 412, e.g., a circumferential seal, forms a sliding seal between annular seal surface 408 of lid 406A and annular seal surface 410 of cylindrical sidewall 404.

In one embodiment, O-ring 412 is mounted within annular seal surface 408 of lid 406A, for example, within an O-ring groove of annular seal surface 408. In accordance with this embodiment, O-ring 412 slides along annular seal surface 410 of cylindrical sidewall 404.

In another embodiment, O-ring 412 is mounted within annular seal surface 410 of cylindrical sidewall 404, for example, within an O-ring groove of annular seal surface 410. In accordance with this embodiment, O-ring 412 slides along annular seal surface 408 of lid 406A.

Figure 8:
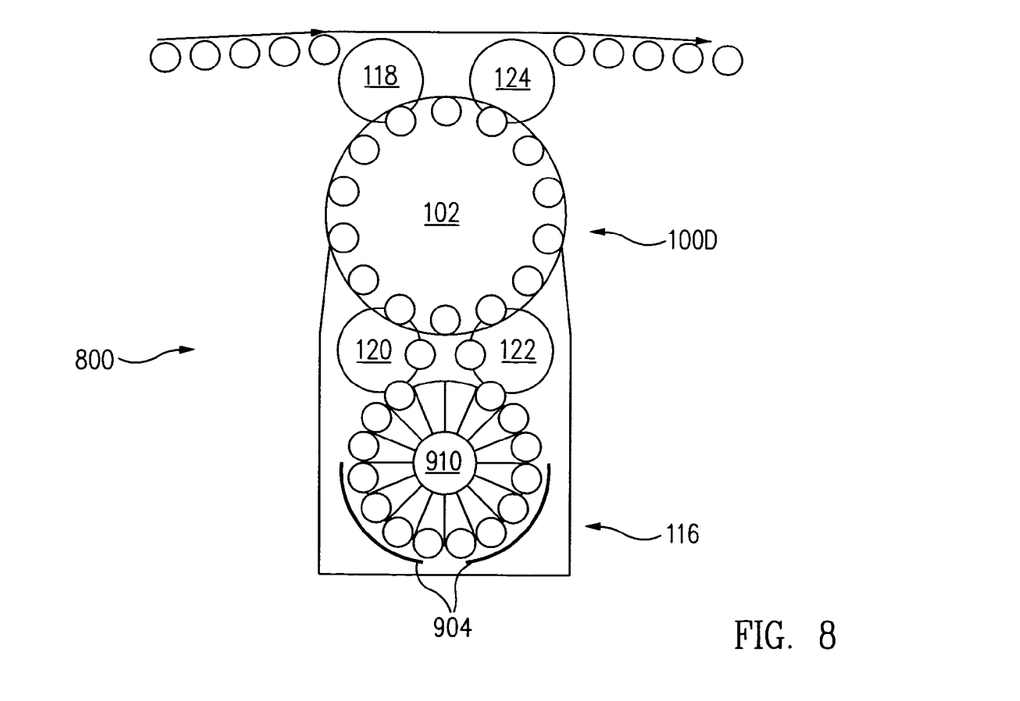
FIGS. 8 and 9 are top and side schematic views of a bottle processing apparatus in accordance with one embodiment of the present invention.
Figure 9:
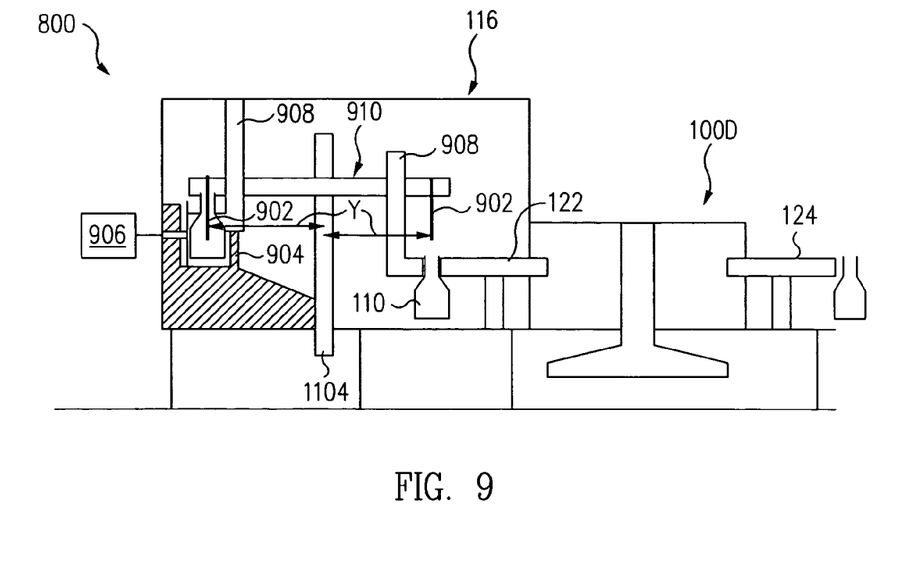

FIGS. 8 and 9 are top and side schematic views of a bottle processing apparatus 800 in accordance with one embodiment of the present invention. Referring now to FIGS. 8 and 9 together, bottle processing apparatus 800 includes a rotary bottle vacuum transfer system 100D mounted to a bottle coating system 116. Rotary bottle vacuum transfer system 100D transfers bottles 110 from atmospheric pressure into a sub-atmospheric pressure region within bottle coating system 116 as discussed above in reference to rotary bottle vacuum transfer system 100. Rotary bottle vacuum transfer system 100D is the same or similar to rotary bottle vacuum transfer system 100 and so is only briefly discussed below to avoid detracting from the principles of the invention.

Bottle coating system 116 includes a rotary coating mechanism that lifts bottles 110 onto a rotating gas inlet 902 that delivers the appropriate gases into the interior of the bottle 110, and through a U-channel 904, sometimes called a U-shaped channel, that is coupled to a power source 906. Power source 906 is for applying electromagnetic radiation to U-channel 904 to generate a plasma inside of the bottle 110 and deposit a thin film coating with gas barrier properties.

As set forth above in reference to FIGS. 1-7, rotary bottle vacuum transfer system 100D includes either a cylindrical sliding seal in contact with a stationary outer wall or a cylindrical sliding surface in contact with a stationary outer seal in one embodiment. Rotary bottle vacuum transfer system 100D provides a means for reducing the pressure of the bottle(s) 110 as they move into bottle coating system 116, sometimes called the processing section. To achieve the pressure reduction, several pumping groups are positioned along the seals entering and exiting rotary bottle vacuum transfer system 100D that pump away the residual atmospheric and process gases in one embodiment. Since there is a constant sealing surface, the pressure is reduced as the bottles 110 pass through rotary bottle vacuum transfer system 100D.

Bottles 110 can either be held in-place (for example by the neck-of the bottle) through rotary bottle vacuum transfer system 100D, or conveyed by an appropriate means. Once the bottle(s) 110 reach the transfer point, they are moved off of rotary bottle vacuum transfer system 100D onto transfer wheel 120 that places the bottle(s) 110 into bottle coating system 116.

Bottle coating system 116, the processing section, includes arms 908 that grasps bottles 110 either by the neck (or other appropriate means) and lift the bottles 110 (through the use of a cam-type device that arms 908 ride on via a rotary mechanism that may include wheels) onto gas inlets 902 and mandrel assemblies. Gas inlets 902 provide a means to convey gases into the interior of the bottle 110 and to establish a processing pressure from which a plasma may be derived. The mandrel assembly provides a means to reduce the gas removal rate from the interior of the bottle 110 (thus establishing a higher pressure inside of the bottle 110 than outside) as well as a means to electrically isolate the bottle 110. In one embodiment, the mandrel of the mandrel assembly is constructed from a polymeric or similar dielectric material. The mandrel assembly is discussed further below in reference to FIG. 11.

Once the bottles 110 are lifted onto the gas inlet 902 and the pressure is established by the introduction of gases, the bottles 110 are transported (note that the bottles 110 are in continuous motion while being lifted onto the gas inlets 902, for example, by a rotary mechanism) through U-channel 904.

U-channel 904 is constructed by sandwiching a conductor (such as copper or silver-plated copper) between 2 layers of polymer (for example, a polymer like acetyl or ultra-high molecular weight polyethylene—both which exhibit very low water adsorption) to provide a capacitive means of coupling power from the radio frequency (13.56 Mhz) or lower frequency, for example 40 kHz, power source 906, e.g., which includes a power supply and impedance matching unit, into the interior of the plastic bottle 110. U-channel 904 is discussed in further detail below with reference to at least FIGS. 12, 13 and 14.

Gas inlet 902 inside of bottle 110 is grounded and acts as the return path for the electric field, allowing a plasma to be established and a thin film coating deposited on the interior surface of bottle 110. Note that the design of gas inlet 902 is such that there are holes oriented along the length of gas inlet 902 (as discussed in greater detail below with reference to FIG. 11) so that the gas is distributed evenly and uniformly into the interior of bottle 110. In another embodiment, a gas inlet with an open end, e.g., a tube, is used. Further note that the gases can either be flowing continuously through gas inlets 902 (even when there is no bottle 110 being lifted or attached) to increase the life-time of gas inlets 902 by retaining gas flow through the holes. Or, alternatively, the gas flow through gas inlets 902 can be toggled on only when a bottle 110 is being lifted onto the gas inlet 902 and mandrel assembly.

The length (linear length as the bottle 110 moves along the arc established by the cylindrical shape of the mechanism holding the gas inlets 902) of the U-channel 904 is selected based on the deposition rate of the process and desired coating thickness. Suitably, the length would be established by a deposition rate on the order of 50-500 Å/second and a desired coating thickness of 50-500 Å.

Once the bottle 110 exits U-channel 904, which can either be configured as one long cylindrically shaped channel or segmented into smaller lengths (to allow several smaller power supplies to be utilized), the bottles 110 are lowered (again by the arm 908 that is holding the bottle 110 moving down the cam at the bottom of the bottle coating system 116, sometimes called the chamber) and then transferred off of a coating wheel 910 of bottle coating system 116 onto transfer wheel 122 and finally onto rotary bottle transfer wheel 102 that delivers the bottle 110 back to atmospheric pressure and onto subsequent filling or storage.

Bottles 110 are coated using bottle processing apparatus 800 in a continuous assembly line fashion at a high rate. In one embodiment, bottles 110 are coated at a rate of at least 20,000 bph, e.g., 40,000 bph, thus maximizing the utilization efficiency of bottle processing apparatus 800.

Further, bottles 110 are treated continuously in an assembly line fashion using common pumping, gas and power systems. This avoids duplication of costs and results in a significant decrease in process cycle time (defined as the time from when a bottle enters the machine until it exits with a thin film coating on the inside).

Although bottle processing apparatus 800 is illustrated and discussed above as including both rotary bottle vacuum transfer system 100D and bottle coating system 116, in one embodiment, the functionality of rotary bottle vacuum transfer system 100D and bottle coating system 116 are combined into a single unit performing both functions.

Figure 10:
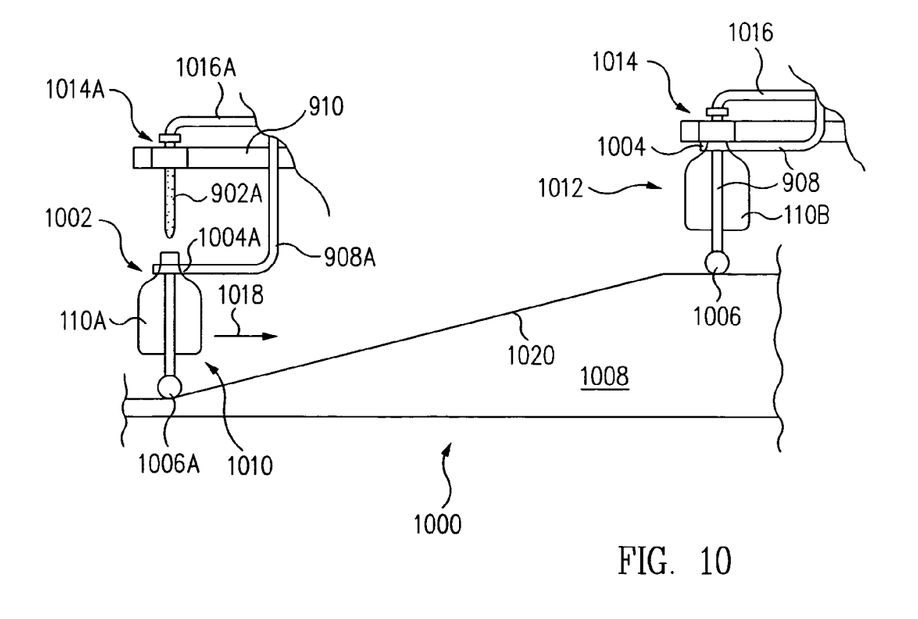
FIG. 10 is a side schematic view of a bottle lift mechanism in accordance with one embodiment of the present invention.

FIG. 10 is a side schematic view of a bottle lift mechanism 1000 in accordance with one embodiment of the present invention. Referring now to FIGS. 8, 9 and 10 together, once the bottles 110 are transferred from atmospheric pressure to vacuum (via rotary bottle vacuum transfer system 100D), the bottles 110 are loaded onto coating wheel 910 of bottle coating system 116. First, the bottle 110 is gripped at the neck 1002 (or in another appropriate manner) with a clip 1004 that holds the bottle 110 in place. The arm 908 that is attached to the clip 1004 is shaped in a right angle with a wheel 1006 at the bottom of the arm 908.

The wheel 1006 rides along the bottom of the chamber on a cam 1008, sometimes called a cam-type path, that lifts the arm 908 (and therefore the bottle 110) up towards and onto the gas inlet 902 as the arm 908 and coating wheel 910 move in a rotary motion at the same rate as the transfer mechanism.

More particularly, referring now to FIG. 10, a first bottle 110A of the plurality of bottles 110 is in a lowered position 1010 as illustrated at the left of bottle lift mechanism 1000 and a second bottle 110B of the plurality of bottles 110 is in an elevated position 1012 as illustrated at the right of bottle lift mechanism 1000.

First bottle 110A is secured to a first arm 908A of the plurality of arms 908 by a first clip 1004A of the plurality of clips 1004. Bottle 110A is directly aligned below a first gas inlet 902A of the plurality of gas inlets 902. Stated another way, gas inlet 902A is concentrically aligned with bottle 110A. Gas inlet 902A is supported by a first mandrel assembly 1014A of a plurality of mandrel assemblies 1014. First arm 908A, first gas inlet 902A and first mandrel assembly 1014A are all part of coating wheel 910 and move together as a single bottle coating station for processing bottle 110A.

Gas inlet 902A is coupled to a process gas supply line 1016A of a plurality of process gas supply lines 1016. During use, process gas is supplied to gas inlet 902A through process gas supply line 1016A, for example, from a common process gas source. In various embodiments, the process gas is a mixture including oxygen and organosilicon. See Felts, U.S. Pat. No. 6,112,695, issued Sep. 5, 2000, entitled "APPARATUS FOR PLASMA DEPOSITION OF A THIN FILM ONTO THE INTERIOR SURFACE OF A CONTAINER", herein incorporated by reference in its entirety, regarding suitable organosilicons.

Although a specific arrangement with first bottle 110A is set forth above, in light of this disclosure, those of skill in the art will understand that a similar arrangement, sometimes called a bottle coating station, is provided for each bottle 110 as the bottle moves through bottle coating system 116. In one embodiment, bottle coating system 116 includes 16 bottle coating stations.

Generally, each bottle 110 is secured to an arm 908 by a clip 1004. Each bottle 110 is directly aligned below a gas inlet 902 supported by a mandrel assembly 1014. Arms 908, gas inlets 902 and mandrel assemblies 1014 are all part of coating wheel 910 and move together as processing stations for processing bottles 110.

The gas inlets 902 are coupled to process gas supply lines 1016. During use, process gas is supplied to gas inlets 902 through process gas supply lines 1016, for example, from a common process gas source.

Referring still to FIG. 10, rotation of coating wheel 910 causes bottle 110A along with arm 908A to move in the direction of an arrow 1018. At the bottom of arm 908A is a wheel 1006A of the plurality of wheels 1006. Wheel 1006A rides along cam 1008.

As shown in FIG. 10, cam 1008 includes a slanted surface 1020, sometimes called a ramp, which is angled with respect to the horizontal. Accordingly, as arm 908A moves along cam 1008, wheel 1006A rolls along and is pushed up by slanted surface 1020 thus also moving arm 908A and bottle 110A up. More particularly, bottle 110A is moved up and around gas inlet 902A and more generally moved to an elevated position such as that of bottle 110B. More particularly, bottle 110B is shown in elevated position 1012 at the top of cam 1008.

Although elevation of bottle 110A from a lowered position to an elevated position is discussed above, in light of this disclosure, those of skill in the art will understand that bottles 110 are also moved from an elevated position to a lowered position using a cam in a similar but reverse manner. To illustrate, if bottle 110B is moved in a direction opposite of arrow 1018 and down cam 1008, bottle 110B will move from elevated position 1012 to a lowered position such as lowered position 1010 of bottle 110A.

Various embodiments for holding the bottles include holding the bottle by the neck with an external clip that is integrated into coating wheel 910, sometimes called the spinning drum, holding the bottles from the base with an external cup type fixture that can be lifted and lowered, and holding the wall of the bottle in an appropriate manner. As discussed above, embodiments of the lifting mechanism include an arm or elevator-type lifting mechanism, either of these could incorporate all of the holding mechanisms discussed above. In an alternative embodiment, the lifting mechanism pushes the bottle from the base (this saves space in the apparatus by eliminating the need to have an arm that rises above the coating wheel).

Figure 11:
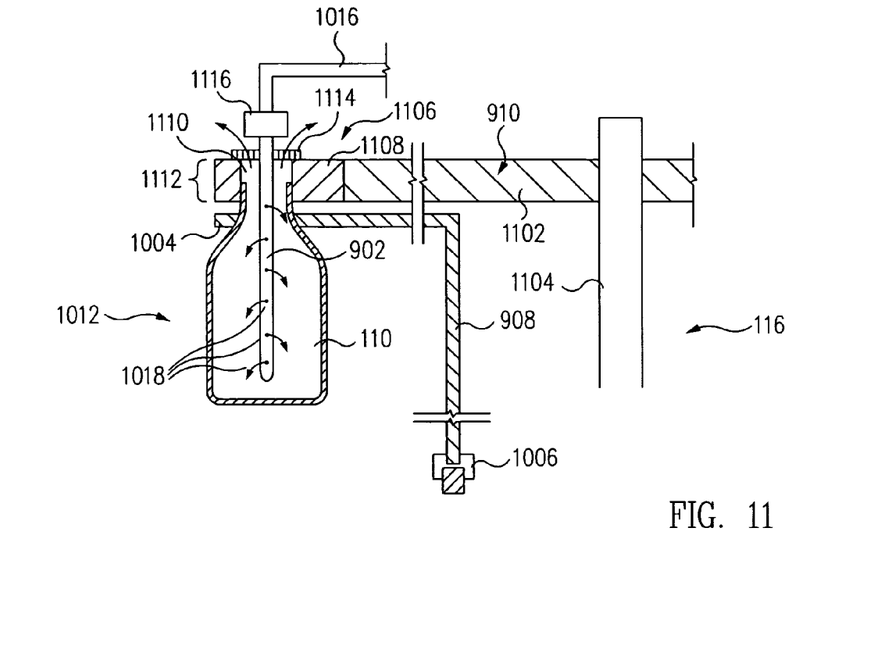
FIG. 11 is a cross-sectional view of a bottle in an elevated position around a gas inlet in accordance with one embodiment of the present invention.

FIG. 11 is a cross-sectional view of a bottle 110 in an elevated position 1012 around a gas inlet 902 in accordance with one embodiment of the present invention. In accordance with this embodiment, coating wheel 910 includes a top plate 1102. Top plate 1102 is mounted to an axle 1104 which rotates coating wheel 910 and top plate 1102. Illustratively, axle 1104 is driven by its own motor or is coupled to the motor of rotary bottle vacuum transfer system 100D (see, for example, motor 416 of FIG. 4) through appropriate mechanical means.

Top plate 1102 includes a mandrel cutout 1106 into which a mandrel 1108 is mounted. Bottle 110 is fitted into a cylindrical opening 1110 in mandrel 1108 and top plate 1102 of coating wheel 910. Opening 1110 is part of mandrel 1108 which is polymeric (although the rest of coating wheel 908 may either be made from a polymer or a metal).

In accordance with this embodiment, mandrel 1108 is a "puck" type design which is screwed (or similarly) attached to top plate 1102 so that bottle changeovers can be accomplished readily. Mandrel 1108 is a dielectric electrically isolating bottle 110 from coating wheel 910 and bottle coating system 116. Further, arm 908 and/or clip 1004 is a dielectric also electrically isolating bottle 110 from coating wheel 910 and bottle coating system 116.

Note that the process gas is flowing continuously through gas inlet 902 in one embodiment. Gas inlet 902 includes a plurality of gas distribution outlets 1118, sometimes called holes, for uniform distribution of the process gas within bottle 110. The process gas is typically mixed (organosilicon and oxygen for example) outside of the chamber as set forth in Felts, U.S. Pat. No. 6,112,695, cited above. This insures good distribution of the process gas and simplifies the gas distribution system.

The complete mandrel assembly 1112 includes mandrel 1108 and a screen 1114 on the top side of mandrel 1108. Gas inlet 902 passes through an opening in screen 1114 and in one embodiment, is supported by screen 1114 and thus mandrel assembly 1112. Gas inlet 902 also passes through cylindrical opening 1110 in mandrel 1108.

Screen 1114 acts as a plasma screen (thus eliminating plasma ignition outside of the bottle). More particularly, screen 1114 is porous allowing process gas to flow through screen 1114. However, screen 1114 restricts the flow of process gas out of bottle 110 thus causing the pressure inside of bottle 110 to be greater than the pressure outside bottle 110. Since the pressure inside bottle 110 is greater than outside bottle 110, the process gas concentration inside bottle 110 is also greater than outside bottle 110. Do to this increased pressure and process gas concentration inside bottle 110, the plasma is preferentially generated inside of bottle 110.

Gas inlet 902 is attached to process gas supply line 1016 of the gas distribution system via a gas coupler 1116. Gas coupler 1116 allows gas inlet 902 to be plugged in and out for ease of maintenance and changeover.

Once bottle 110 is lifted onto gas inlet 902 as discussed above in reference to FIG. 10, bottle 110 continues onto the U-channel for coating as discussed in greater detail below with reference to FIGS. 12, 13 and 14.

Figure 12:
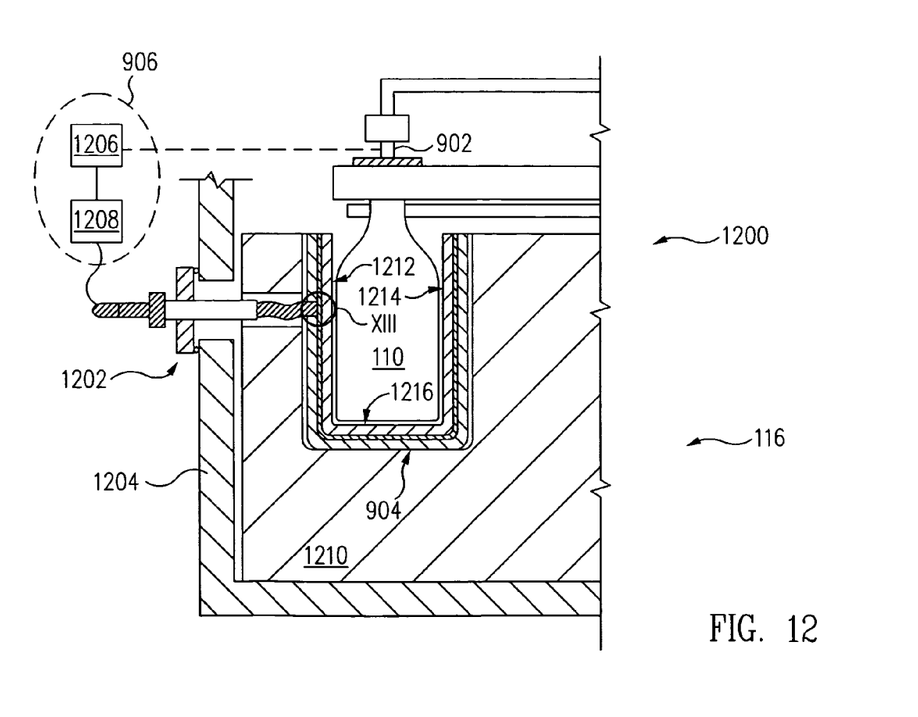
FIG. 12 is a cross-sectional view of a bottle within a U-channel in accordance with one embodiment of the present invention.

FIG. 12 is a cross-sectional view of a bottle 110 within U-channel 904 in accordance with one embodiment of the present invention. FIG. 13 is an enlarged cross-sectional view of the region XIII of U-channel 904 of FIG. 12. FIG. 14 is a schematic top view of U-channel 904 of FIG. 12 in accordance with one embodiment of the present invention.

Figure 13:
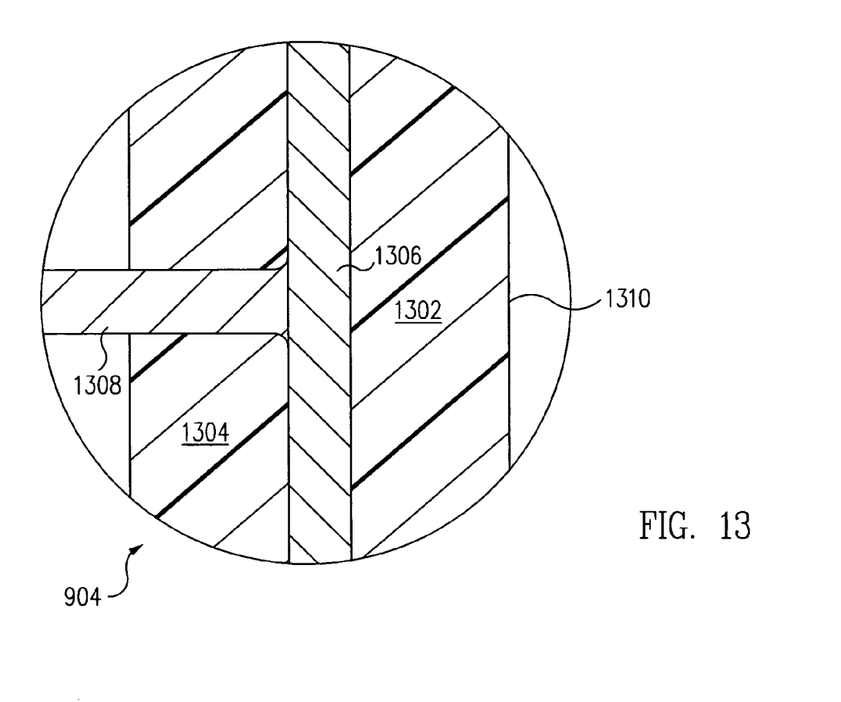
FIG. 13 is an enlarged cross-sectional view of the region XIII of the U-channel of FIG. 12.
Figure 14:
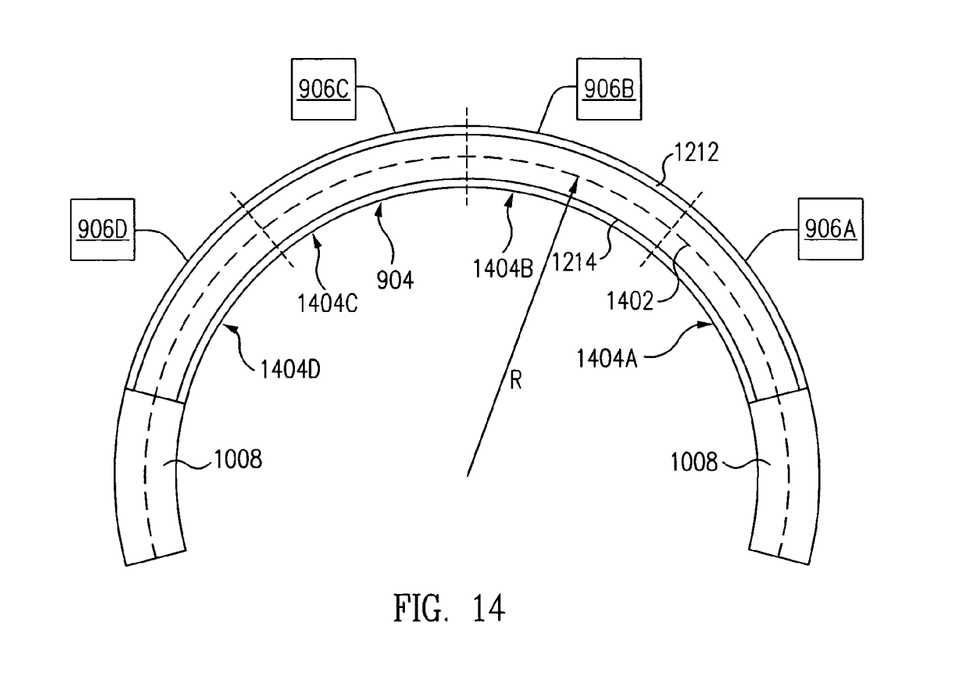
FIG. 14 is a schematic top view of the U-channel of FIG. 12 in accordance with one embodiment of the present invention.

Referring now to FIGS. 12, 13 and 14 together, after the bottles are lifted onto the gas inlet and into the mandrel in the top plate of the coating wheel as discussed above in reference to FIGS. 10 and 11, the bottles continue in a rotary motion into the coating section 1200 of bottle coating system 116.

Coating section 1200 includes a powered U-channel 904 that is constructed from a polymer/metal/polymer laminate in one embodiment. For example, referring to FIG. 13, U-channel 904 includes an inner dielectric layer 1302, e.g., a polymer, an outer dielectric layer 1304, e.g., also a polymer, and a conductive layer 1306, e.g., metal. Conductive layer 1306 is electrically connected to a power source conductor 1308, sometimes called an RF feed.

In one embodiment, an interior surface 1310 of U-channel 904 is polymeric, e.g., inner dielectric layer 1302 is a polymer or coated with a polymer. By forming interior surface 1310 to be polymeric, any friction and heating of the bottle surface of bottle 110 in contact with U-channel 904 is reduced. Tolerances is maintained to keep bottle 110 within approximately ⅟₁₆" of interior surface 1310 of U-channel 904 and no more than ¼" in one embodiment.

Interior surface 1310 of U-channel 904 includes an outer sidewall 1212, an inner sidewall 1214, and a base 1216. Generally, outer sidewall 1212 and inner sidewall 1214 are vertical cylindrical surfaces and base 1216 is a horizontal annular surface extending from inner sidewall 1214 to outer sidewall 1212.

During use, conductive layer 1306 is powered by an external power source 906. More particularly, U-channel 904 receives its power from a power source 906 through a stationary power feedthrough 1202 that can deliver power from 40 kHz to 13.56 MHz or higher frequencies as appropriate. Stationary power feedthrough 1202 forms a vacuum tight seal with an outer wall 1204 of bottle coating system 116. Stationary power feedthroughs such as stationary power feedthrough 1202 are well known to those of skill in the art and so is not discussed in further detail to avoid detracting from the principles of the invention.

The connection to U-channel 904 from power feedthrough 1202 is achieved either through a mechanical coupling or by soldering a copper strap between the two. For example, in one embodiment, power source conductor 1308 is a copper strap electrically connected to power feedthrough 1202.

In one embodiment, power source 906 includes a power supply 1206, e.g., an AC power supply, and an impedance matching network 1208. Power supplies and impedance matching networks such as power supply 1206 and impeding matching network 1208 are well known to those of skill in the art and so are not discussed in detail to avoid detracting from the principles of the invention.

In one embodiment, power feedthrough 1202 is connected to impedance matching network 1208 in as close proximity as possible. Impedance matching network 1208 is connected to power supply 1206 via a simple coaxial cable. To complete the electrical circuit, power supply 1206 is also electrically coupled to gas inlet 902, which operates as a counter electrode for power supply 1206.

Figure 16:
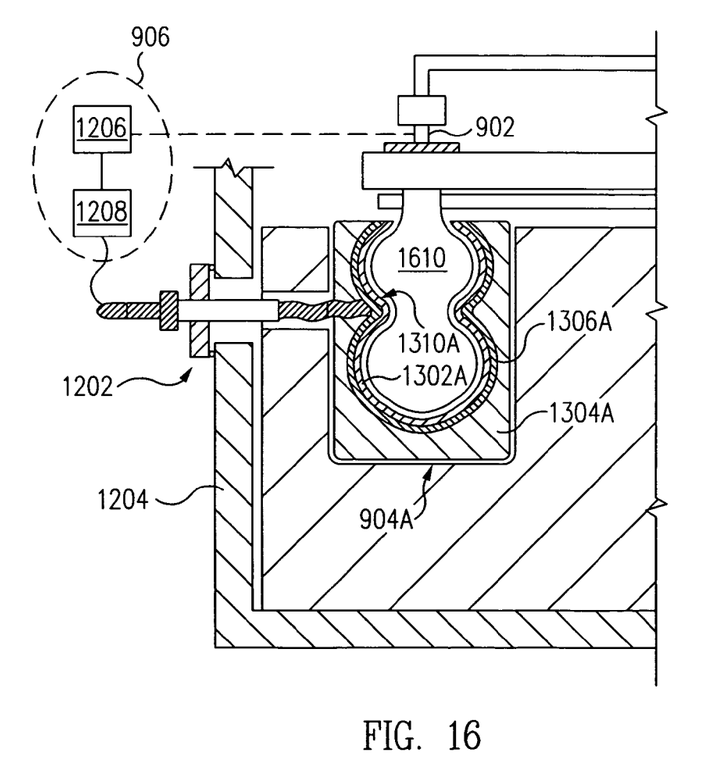
FIG. 16 is a cross-sectional view of a hoop-skirt bottle within a U-channel in accordance with another embodiment of the present invention.

As illustrated in FIG. 12, U-channel 904 is U-shaped. However, in another embodiment, interior surface 1310 of U-channel 904 corresponds in shape to bottle 110. More particularly, interior surface 1310 has the identical shape as the exterior surface of bottle 110, but is slightly larger than bottle 110 to avoid contact with bottle 110. Stated another way, interior surface 1310 is shaped to mimic the outside dimensions of the particular bottle, for example a "hoop-skirt" design found in COCA-COLA® bottles as illustrated in FIG. 16. The channel section (or sections) are easily removed from the chamber so that bottle size and shape changeovers are simplified.

FIG. 16 is a cross-sectional view of a hoop-skirt bottle 1610 within a U-channel 904A in accordance with another embodiment of the present invention. U-channel 904A includes an inner dielectric layer 1302A, e.g., a polymer, an outer dielectric layer 1304A, e.g., also a polymer, and a conductive layer 1306A. Interior surface 1310A of U-channel 904A corresponds in shape to hoop-skirt bottle 1610. In accordance with this embodiment, inner dielectric layer 1302A and conductive layer 1306A also correspond in shape to hoop-skirt bottle 1610.

Referring again to FIG. 12, inside of bottle coating system 116, referred to as the chamber for simplicity, U-channel 904 is supported by a U-channel support block 1210. In one embodiment, U-channel support block 1210 includes a polymeric material (either in a singular block or multiple blocks) that acts to shield the remaining chamber and as a means of significantly reducing the interior volume of the chamber. The reduction of chamber volume provides a benefit to the overall operation of the apparatus, since pumping speed requirements will be significantly reduced. The type of polymer of U-channel support block 1210 typically has a low water uptake and stability at moderate temperatures. Illustrative polymeric materials, e.g., for inner dielectric layer 1302, outer dielectric layer 1304, and U-channel support block 1210, include acetyl (DELRIN™) or ultra-high-molecular-weight polyethylene (UHMWPE) or similar material. Cam 1008 discussed above in FIG. 10 is integrated, e.g., a part of, U-channel support block 1210 in one embodiment simplifying the design further. Two cams 1008 for raising and lowering bottles 110 are illustrated in FIG. 14 as an example.

Referring now to FIG. 14, U-channel 904 is one large cylindrically shaped channel in one embodiment. More particularly, a radius R to the center of U-channel 904, i.e., the circumferential path 1402 along which bottles 110 travel, equals the distance Y (FIG. 9), sometimes called the radius, of gas inlets 902 from axle 1104. Stated another way, circumferential path 1402 lies on the circumference of a circle equidistant from outer sidewall 1212 and inner sidewall 1214 and having radius R.

In one embodiment, U-channel 904 includes a plurality of U-channels 1404A, 1404B, 1404C, 1404D, collectively U-channels 1404, electrically isolated from one another. Further, each U-channel 1404A, 1404B, 1404C, 1404D has its own power source 906A, 906B, 906C, 906D, respectively. In this manner, the power input to each U-channel 1404 is independently controlled.

By using several smaller U-channels 1404, varying power levels are allowed to be applied to the plasma in real-time and the inclusion of redundancy in the apparatus insuring maximum mean-time-between-failure (MTBF).

Figure 15:
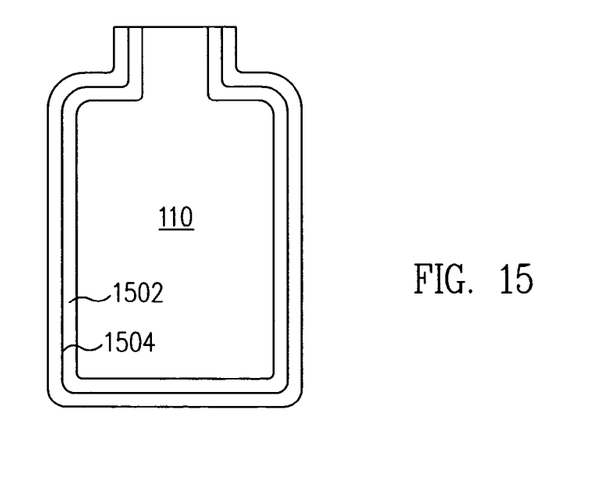
FIG. 15 is a cross-sectional view of a bottle having a barrier coating deposited on the interior surface of the bottle in accordance with one embodiment of the present invention.

FIG. 15 is a cross-sectional view of a bottle 110 having a barrier coating 1502 deposited on an interior surface 1504 of bottle 110 in accordance with one embodiment of the present invention. Barrier coating 1502 is deposited using bottle processing apparatus 800 as discussed herein. Barrier coating 1502 is located on the interior surface 1504 of bottle 110. Barrier coating 1502 is deposited through the plasma decomposition of a 2 component gas including an organosilicon and oxygen in one embodiment. Illustrative organosilicon materials include hexamethyldisiloxane and 1,1,3,3-tetramethyldisiloxane. The organosilicon material provides the Si—O—Si linkage which is then combined with oxygen to yield silicon dioxide or sub-oxides (depending on the ratio of oxygen to organosilicon gas that is flowed into the chamber and the power level).

Barrier coating 1502 includes small amounts of carbon (up to approximately 3%) in one embodiment. In accordance with this embodiment, barrier coating 1502 is designated as SiOCH and provides greater ductility if the application requires that barrier coating 1502 have elasticity.

Figure 17:
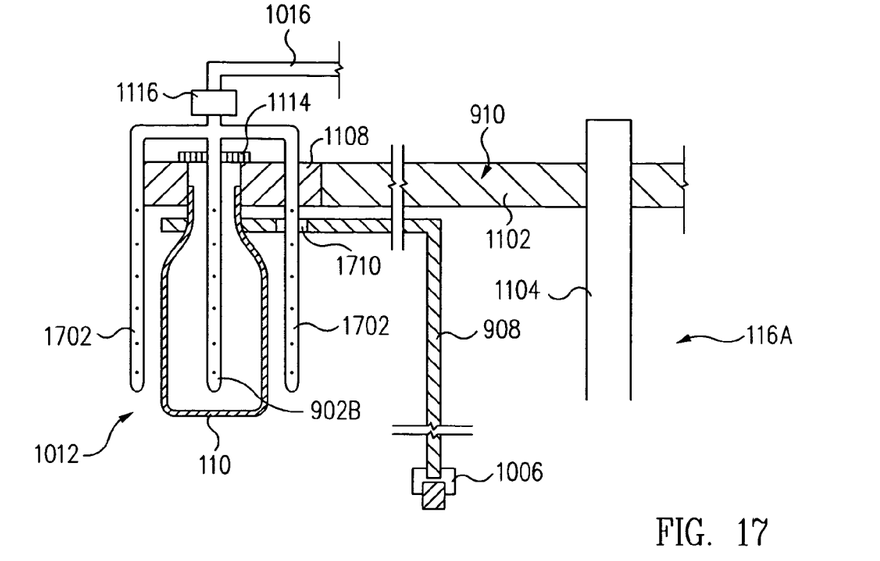
FIG. 17 is a cross-sectional view of a bottle in an elevated position around a gas inlet in accordance with yet another embodiment of the present invention.
Figure 18:
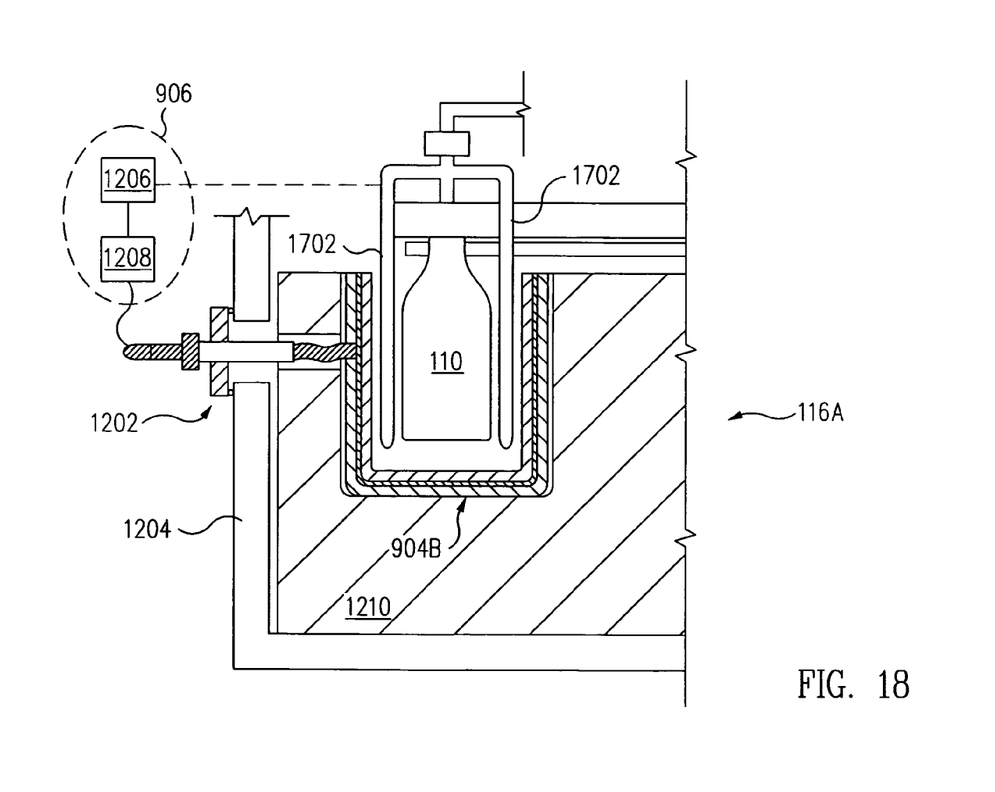
FIG. 18 is a cross-sectional view of the bottle of FIG. 17 within a U-channel in accordance with one embodiment of the present invention.

FIG. 17 is a cross-sectional view of a bottle 110 in an elevated position 1012 around a gas inlet 902B in accordance with yet another embodiment of the present invention. FIG. 18 is a cross-sectional view of bottle 110 of FIG. 17 within a U-channel 904B in accordance with one embodiment of the present invention. Referring now to FIGS. 17 and 18 together, a bottle coating system 116A for simultaneously forming a barrier coating on the exterior and/or interior surfaces of the bottle 110 is illustrated. Bottle coating system 116A of FIGS. 17 and 18 is similar to bottle coating system 116 of FIGS. 11 and 12 and only the significant differences between bottle coating system 116A and bottle coating system 116 are discussed below.

As shown in FIGS. 17 and 18, bottle coating system 116A includes at least one exterior gas inlet, e.g., two exterior gas inlets 1702, outside of bottle 110 and gas inlet 902B inside bottle 110. Although two exterior gas inlets 1702 are illustrated, in one embodiment, two additional exterior gas inlets 1702, i.e., for a total of four exterior gas inlets 1702, in front of and behind bottle 110 are used to insure uniform gas distribution around the outside of bottle 110.

Exterior gas inlets 1702 allow gas to be diverted to the outside of bottle 110 (by dividing the flow between interior gas inlet 902B and exterior gas inlets 1702) for subsequent coating. In the same manner as described in FIG. 10 above, bottle 110 is lifted up to the gas inlets 902B, 1702 by the lifting arm 908. Depending on the location of the exterior gas inlets 1702 and arm 908, in one embodiment, a hole 1710 is provided in arm 908 that allows the exterior gas inlets 1702, e.g., the inside inlet, to not interfere with arm 908.

In another embodiment, interior gas inlet 902B is not used. In accordance with this embodiment, bottle coating system 116A only forms a barrier coating on the outside of bottle 110. Specific applications include those that require the exterior surface to have specific properties such as low surface energy (non-wettable) which was demonstrated previously with silicon oxide coatings produced from organosilicon materials.

To accommodate the gas inlet system including exterior gas inlets 1702, U-channel 904B is shaped to prevent U-channel 904B from contacting exterior gas inlets 1702 as illustrated in FIG. 18. This is readily achieved by enlarging the U-channel (polymer/metal/polymer) structure and decreasing the volume of the polymeric blocks described earlier. The remaining attributes of the bottle coating system 116A as described previously would be the same.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A system comprising:
a plurality of gas inlets;
a top plate mounted to an axle;
mandrel assemblies for supporting said gas inlets mounted in mandrel cutouts of said top plate;
a bottle lift mechanism for lifting bottles around said gas inlets and into said mandrel assemblies;
a U-channel having a cylindrical shape such that a radius to a center of said U-channel equals a distance of said gas inlets from said axle, said U-channel comprising a vertical cylindrical outer sidewall concentric with said center of said U-channel and having a first radius from said axle, a vertical cylindrical inner sidewall concentric with said outer sidewall and having a second radius from said axle less than said first radius, and a horizontal annular base extending from said inner sidewall to said outer sidewall.

2. The system of claim 1 further comprising:
a chamber comprising an interior cylindrical surface;
at least one vacuum port in said interior cylindrical surface; and
a rotary bottle transfer wheel within said chamber, said rotary bottle transfer wheel comprising:
an exterior cylindrical surface directly adjacent said interior cylindrical surface of said chamber; and
bottle cutouts in said exterior cylindrical surface.

3. The system of claim 2 wherein said chamber comprises an atmospheric port and a vacuum port.

4. The system of claim 2 wherein said interior cylindrical surface comprises a pressure reduction section and a pressure increasing section.

5. The system of claim 4 wherein said at least one vacuum port comprises a first vacuum port in said pressure reduction section and a first vacuum port in said pressure increasing section.

6. The system of claim 4 wherein said at least one vacuum port comprises a plurality of vacuum ports in said pressure reduction section and a plurality of vacuum ports in said pressure increasing section.

7. The system of claim 1 further comprising a vacuum pump coupled to said at least one vacuum port.

8. The system of claim 1 wherein said chamber further comprises:
a base;
a cylindrical sidewall comprising said interior cylindrical surface; and
a lid.

9. The system of claim 8 wherein said lid comprises an annular seal surface and wherein said cylindrical sidewall comprises an annular seal surface, said system further comprising a seal between said annular seal surface of said lid and said annular seal surface of said cylindrical sidewall.

10. The system of claim 1 wherein said rotary bottle transfer wheel is mounted on an axle, said system further comprising a motor for rotating said axle and said rotary bottle transfer wheel.

11. The system of claim 1 further comprising:
at least one sliding seal between said rotary bottle transfer wheel and said chamber.

12. The system of claim 11 further comprising a power source coupled to said U-channel.

13. The system of claim 12 wherein said power source is further coupled to said gas inlets.

14. The system of claim 11 wherein said bottle lift mechanism comprises:
arms comprising wheels;
clips for grasping said bottles attached to said arms; and
a cam upon which said wheels ride.

15. The system of claim 14 wherein said cam comprises a slanted surface.

16. The system of claim 11 wherein said mandrel assemblies comprise:
mandrels;
screens at a top of said mandrels.

17. The system of claim 16 wherein said mandrels comprise a dielectric material.

18. The system of claim 16 wherein said screens restrict a flow of process gas out of said bottles.

19. The system of claim 11 wherein an interior surface of said U-channel corresponds in shape to said bottles.

20. The system of claim 11 further comprising:
a rotary bottle vacuum transfer system for taking said bottles from atmospheric pressure and transferring said bottles to a bottle coating system at a sub-atmospheric pressure in a continuous assembly line fashion; said bottle coating system comprising:
said plurality of gas inlets;
said top plate mounted to said axle;
said mandrel assemblies;
said bottle lift mechanism;
said U-channel, wherein said bottle coating system is for forming a thin film coating having barrier properties on at least one surface of said bottles in said continuous assembly line fashion.

21. The system of claim 20 wherein said rotary bottle vacuum transfer system is further for returning said bottles from said sub-atmospheric pressure region of said bottle coating system back to said atmospheric pressure in said continuous assembly line fashion.

* * * * *